US011556686B2

(12) United States Patent
Boixo Castrillo et al.

(10) Patent No.: US 11,556,686 B2
(45) Date of Patent: Jan. 17, 2023

(54) SIMULATION OF QUANTUM CIRCUITS

(71) Applicant: Google LLC, Mountain View, CA (US)

(72) Inventors: Sergio Boixo Castrillo, Rancho Palos Verdes, CA (US); Vadim Smelyanskiy, Mountain View, CA (US)

(73) Assignee: Google LLC, Mountain View, CA (US)

( * ) Notice: Subject to any disclaimer, the term of this patent is extended or adjusted under 35 U.S.C. 154(b) by 299 days.

(21) Appl. No.: 16/754,998

(22) PCT Filed: Dec. 18, 2017

(86) PCT No.: PCT/US2017/067083
§ 371 (c)(1),
(2) Date: Apr. 9, 2020

(87) PCT Pub. No.: WO2019/078907
PCT Pub. Date: Apr. 25, 2019

(65) Prior Publication Data
US 2021/0192114 A1 Jun. 24, 2021

Related U.S. Application Data

(60) Provisional application No. 62/574,050, filed on Oct. 18, 2017.

(51) Int. Cl.
*G06F 30/3308* (2020.01)
*G06N 10/00* (2022.01)
*G06F 7/544* (2006.01)

(52) U.S. Cl.
CPC ......... *G06F 30/3308* (2020.01); *G06N 10/00* (2019.01); *G06F 7/5443* (2013.01)

(58) Field of Classification Search
USPC .......................................................... 703/14
See application file for complete search history.

(56) References Cited

U.S. PATENT DOCUMENTS

2011/0060710 A1* 3/2011 Amin ...................... G06F 15/16
706/13

OTHER PUBLICATIONS

Boixo et al, "Characterizing quantum supremacy in near-term devices" arXiv, Apr. 2017, 23 pages.
(Continued)

*Primary Examiner* — Bryce M Aisaka
(74) *Attorney, Agent, or Firm* — Fish & Richardson P.C.

(57) ABSTRACT

Methods, systems and apparatus for simulating quantum circuits including multiple quantum logic gates. In one aspect, a method includes the actions of representing the multiple quantum logic gates as functions of one or more classical Boolean variables that define a undirected graphical model with each classical Boolean variable representing a vertex in the model and each function of respective classical Boolean variables representing a clique between vertices corresponding to the respective classical Boolean variables; representing the probability of obtaining a particular output bit string from the quantum circuit as a first sum of products of the functions; and calculating the probability of obtaining the particular output bit string from the quantum circuit by directly evaluating the sum of products of the functions. The calculated partition function is used to (i) calibrate, (ii) validate, or (iii) benchmark quantum computing hardware implementing a quantum circuit.

20 Claims, 9 Drawing Sheets

(56) References Cited

OTHER PUBLICATIONS

Dechter, "Bucket Elimination: a unifying framework for processing hard and soft constraints" Constraints: An International Journal, Jan. 1998, 6 pages.
PCT International Preliminary Report on Patentability in International Application No. PCT/US2017/067083, dated Apr. 21, 2020, 12 pages.
PCT International Search Report and Written Opinion in International Application No. PCT/US2017/067083, dated Jul. 11, 2018, 18 pages.
Pednault et al, "Breaking the 49-Qubit Barrier in the Simulation of Quantum Circuits" arXiv, Oct. 2017, 24 pages.
Zhang et al, "Exploiting Causal Independence in Bayesian Network Inference" arXiv, Dec. 1996, 28 pages.
EP Office Action in European Application No. 17829097.9, dated Jan. 21, 2021, 10 pages.
CA Office Action in Canadian Application No. 3,079,533, dated Jun. 1, 2021, 3 pages.

\* cited by examiner

SIMULATION OF QUANTUM CIRCUITS

This application is a National Stage Application under 35 U.S.C. § 371 and claims the benefit of International Application No. PCT/US2017/067083, filed Dec. 18, 2017, which claims priority to U.S. Application No. 62/574,050, filed Oct. 18, 2017, the disclosure of which is incorporated herein by reference.

BACKGROUND

This specification relates to quantum computing.

A quantum circuit is a model for quantum computation in which a computation is a sequence of quantum logic gates—reversible transformations on an n-qubit register.

SUMMARY

This specification describes technologies for simulating quantum circuits. In particular, methods and systems for partition function simulation of two-dimensional quantum circuits and simulation of quantum circuits using controlled-phase gates are described.

In general, one innovative aspect of the subject matter described in this specification can be implemented in a method for simulating a quantum circuit, wherein the quantum circuit comprises multiple quantum logic gates, the method including: representing the multiple quantum logic gates as functions of one or more classical Boolean variables, wherein the functions of one or more classical Boolean variables define a undirected graphical model with each classical Boolean variable representing a vertex in the undirected graphical model and each function of respective classical Boolean variables representing a clique between vertices corresponding to the respective classical Boolean variables; representing the probability of obtaining a particular output bit string from the quantum circuit as a first sum of products of the functions; and calculating the probability of obtaining the particular output bit string from the quantum circuit by directly evaluating the sum of products of the functions.

Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations directly evaluating the sum of products of the functions comprises applying techniques for performing exact inference for undirected graphical models.

In some implementations applying techniques for performing exact inference for undirected graphical models comprises applying a variable elimination algorithm.

In some implementations applying a variable elimination algorithm comprises: approximating the treewidth of the defined undirected graphical model; determining, based on the approximated treewidth, an order of elimination for the variable elimination algorithm; and evaluating the sum of products of the functions by performing the variable elimination algorithm with the determined order of elimination.

In some implementations applying a variable elimination algorithm comprises determining a vertical order of elimination for the variable elimination algorithm and performing the variable elimination algorithm using the determined order In some implementations the classical Boolean variables enumerate (i) each qubit in a system of qubits on which the quantum circuit operates, and, for each qubit (ii) new variables along the worldline of the qubit.

In some implementations calculating the probability of obtaining the particular output bit string from the quantum circuit by directly evaluating the sum of products of the functions comprises: fixing the value of a first classical Boolean variable in each worldline to zero; and fixing the value of a last classical Boolean variable in the worldline of qubit j to a value in the bit string corresponding to position j.

In some implementations representing the multiple quantum logic gates as functions of one or more classical Boolean variables comprises, for each diagonal one qubit quantum logic gate: representing the quantum logic gate as a one-variable function that takes, as input, a classical Boolean variable indexing an element in the diagonal of a matrix representation of the quantum logic gate and provides, as output, the value of the element.

In some implementations each input classical Boolean variable of the one-variable function is mapped to a vertex corresponding to this variable in the undirected graphical model.

In some implementations representing the multiple quantum logic gates as functions of one or more classical Boolean variables comprises, for each non-diagonal one qubit quantum logic gate: representing the quantum logic gate as a two-variable function that takes, as input, a pair of two classical Boolean variables indexing an element of a matrix representation of the quantum logic gate and provides, as output, a corresponding value of the element.

In some implementations each function of a pair of input classical Boolean variables is mapped to an edge connecting two vertices corresponding to these variables in the undirected graphical model.

In some implementations representing the multiple quantum logic gates as functions of one or more classical Boolean variables comprises, for each diagonal two qubit quantum logic gate: representing the quantum logic gate as a two-variable function that takes, as input, a pair of two classical Boolean variable indexing an element in the diagonal of a matrix representation of the quantum logic gate and provides, as output, the value of the element.

In some implementations each function of a pair of input classical Boolean variables is mapped to an edge connecting two vertices corresponding to these variables in the undirected graphical model.

In some implementations representing the multiple quantum logic gates as functions of one or more classical Boolean variables comprises, for each non-diagonal two qubit quantum logic gate: representing the quantum logic gate as a four-variable function that takes, as input, four classical Boolean variable indexing an element of a matrix representation of the quantum logic gate and provides, as output, a corresponding value of the element.

In some implementations each function of four input classical Boolean variables is mapped to links connecting four fully connected vertices corresponding to these variables in the undirected graphical model.

In some implementations the method further comprises using the calculated probability to determine the performance of the quantum circuit.

In some implementations the method further comprises using the calculated probability to (i) calibrate, (ii) validate, or (iii) benchmark quantum computing hardware implementing the quantum circuit.

In some implementations the method further comprises representing the expected value of an operator as a second sum of products of the functions; and calculating the defined expected value of the operator by directly evaluating the sum of products of the functions.

In general, another innovative aspect of the subject matter described in this specification can be implemented in a method for simulating a quantum circuit, the method including: representing the quantum circuit as a product of unitary matrices corresponding to a sequence of clock cycles; representing a probability that a predefined bit string is output after application of a final clock cycle of the quantum circuit on a system of qubits as a partition function of a classical Ising model at imaginary temperature, the probability being dependent on the product of unitary matrices; and exactly calculating the partition function to determine the probability that the predefined bit string is output after application of the final clock cycle of the quantum circuit on the system of qubits, comprising applying an algorithm for performing exact inference on graphical models.

Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations exactly calculating the partition function comprises: representing the classical Ising model as a graphical model, the graphical model comprises nodes representing spins in the classical Ising model and edges representing interactions between spins; determining the treewidth of the graphical model; and applying, using the determined treewidth, an algorithm developed for performing exact inference on graphical models to calculate the partition function of the classical Ising model.

In some implementations the algorithm developed for performing exact inference on graphical models comprises a bucket elimination algorithm or a variable elimination algorithm.

In some implementations the computational cost of the algorithm is exponential in the treewidth of the graphical model representation of the classical Ising model.

In some implementations representing the probability that a predefined bit string is output after application of a final clock cycle of the quantum circuit as a partition function of a classical Ising model at imaginary temperature comprises: expressing the probability as a path integral comprising multiple phase factors associated with paths in the path integral; and determining values of the phase factors accumulated as a sum of discrete phase changes associated with quantum logic gates in the quantum circuit.

In some implementations the quantum circuit is configured to operate on qubits arranged as a two-dimensional lattice.

In some implementations the quantum circuit comprises (i) controlled-phase, (ii) $X^{1/2}$, (iii) $Y^{1/2}$, and (iv) non-Clifford T quantum logic gates.

In some implementations the quantum circuit comprises a depth of d clock cycles.

In some implementations the imaginary temperature comprises $$\frac{i\pi}{4}.$$

In some implementations the probability that a predefined bit string is output after application of a final clock cycle of the quantum circuit on a system of qubits is given by $$\langle x|\psi_d\rangle = \sum_{\{\sigma_t\}} \prod_{t=0}^{d} \langle \sigma^t|U^{(t)}|\sigma^{t-1}\rangle, |\sigma^d\rangle = |x\rangle$$

where $|x\rangle$ represents the predefined bit string, $|\psi_d\rangle$ represents the state of the system of n qubits after application of the final clock cycle d of the quantum circuit, $U^{(t)}$ represents the product of unitary matrices corresponding to the sequence of clock cycles 1 to d, and $|\sigma^t\rangle = \otimes_{j=1}^{n}|\sigma_j^t\rangle$ with the assignments of $\sigma_j^t = \pm 1$ corresponding to the states 0 and 1 of the j-th qubit, respectively.

In some implementations the partition function of the classical Ising model at imaginary temperature is given by $$\langle x|\psi_d\rangle = 2^{-G/2} \sum_s \exp\left(\frac{i\pi}{4} H_S(x)\right)$$

where $$\frac{i\pi}{4} H_S(x)$$

represents the phase factors associated with each path in the path integral and $2^{-G/2}$ represents absolute values of probability amplitudes associated with the paths in the path integral.

In some implementations the calculated partition function is used to determine the performance of the quantum circuit.

In some implementations the calculated partition function is used to (i) calibrate, (ii) validate, or (iii) benchmark quantum computing hardware implementing the quantum circuit.

The subject matter described in this specification can be implemented in particular ways so as to realize one or more of the following advantages.

Systems and methods for simulating quantum circuits, as described in this specification, provide a more efficient use of computational resources and provide computational and practical improvements over existing methods for simulating a quantum circuit.

Furthermore, the systems and methods for simulating quantum circuits, as described in this specification, can be used to improve quantum computing hardware. For example, simulation results generated by the systems and methods described in this specification may be used to calibrate or validate quantum computing hardware, or to determine adjustments that may improve the accuracy or efficiency of existing quantum computing hardware.

Systems and methods for simulating quantum circuits, as described in this specification, may be implemented at scale using modest computational resources, e.g., on a workstation.

Details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
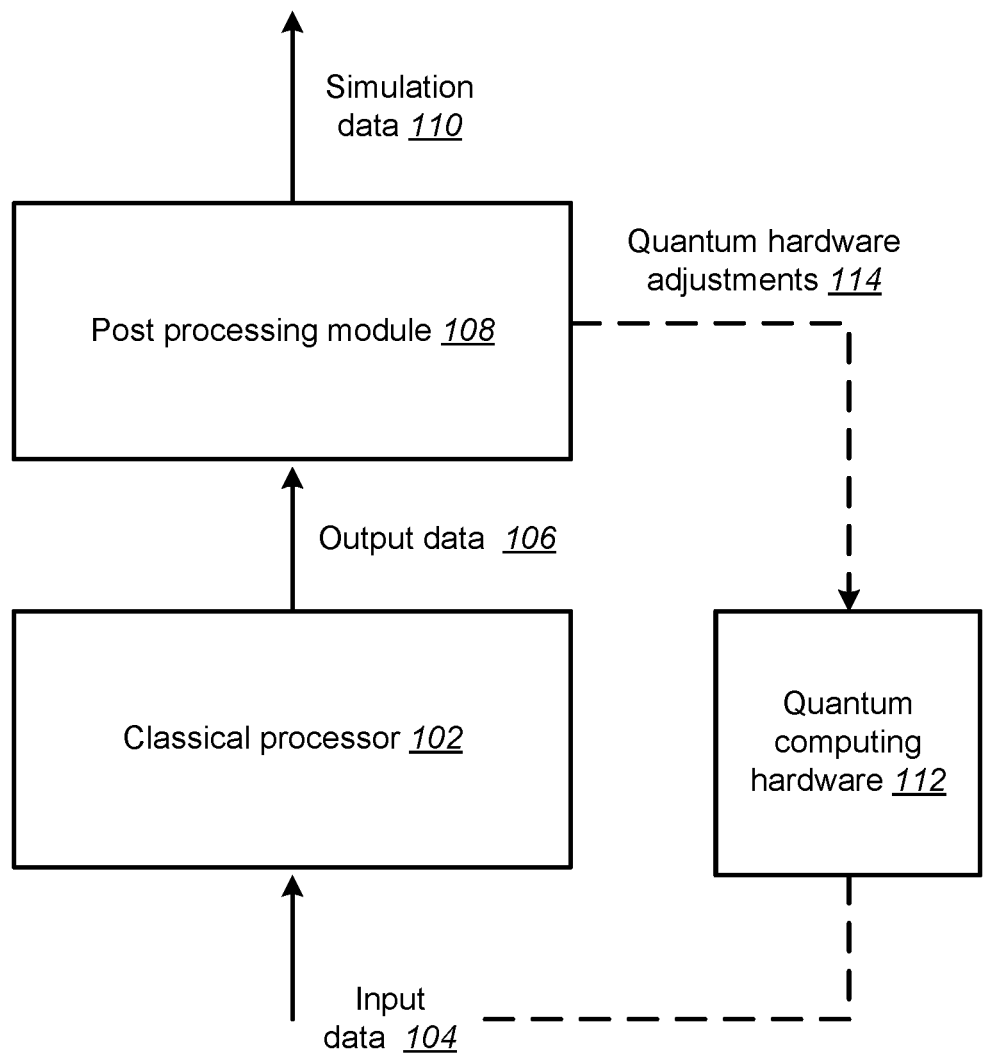
FIG. 1 depicts an example system for simulating quantum circuits.

Simulating quantum circuits is an essential part of fabricating quantum hardware. For example, simulating quantum circuits can be used to calibrate, validate and benchmark emerging quantum computing hardware and architectures.

Conventional processes for simulating a generic quantum circuit, e.g., a circuit without symmetries that allow for faster shortcuts or emulations, typically require extensive computational resources and technical optimizations. For example, conventional processes for simulating quantum circuits translate applications of quantum logic gates included in a quantum circuit to respective optimized effective matrix multiplications using extensive technical optimization techniques. The optimized effective matrix multiplications are then directly applied to a vector state using computers with high levels of computing performance, e.g., classical supercomputers.

Computing time in a supercomputer is scarce and expensive. Furthermore, even supercomputers may not be able to simulate quantum circuits at scale. For example, benchmarked results for simulating quantum circuits with only 9×5 qubits and depth 25 exhaust current classical supercomputers.

Simulating generic quantum circuits at scale without the use of brute force calculations, approximations and/or extensive computational resources is therefore a technical problem of great importance in the area of quantum computing.

This specification describes methods and systems for more efficiently simulating a low depth quantum circuit with controlled-phase gates. An output amplitude of the quantum circuit is represented as an undirected graphical model, which is then solved using an exact inference algorithm in probabilistic graphical models, e.g., a variable elimination algorithm, using the property that controlled-phase gates are diagonal in the computational basis. The computational cost of the method is exponential in the treewidth of the undirected graph.

This specification also describes methods and systems for more efficiently simulating a generic quantum circuit by directly mapping the quantum circuit to the partition function of an Ising model in imaginary time. The partition function may be exactly solved using algorithms developed in the context of exact inference for graphical models. The term "exactly solved" or "exactly calculated" means solving or calculating without applying approximations. The methods described in this specification may therefore be implemented at scale using modest computational resources, e.g., on a workstation.

The described systems and methods result in a more efficient use of computational resources and provide computational and practical improvements over existing methods for simulating a quantum circuit. Furthermore, the described systems and methods can be used to improve quantum computing hardware. For example, simulation results generated by the systems and methods described in this specification may be used to calibrate or validate quantum computing hardware, or to determine adjustments that may improve the accuracy or efficiency of existing quantum computing hardware.

Example Hardware

FIG. 1 depicts an example system 100 for simulating a quantum circuit. The example system 100 is an example of a system implemented as classical computer programs on one or more classical computers in one or more locations, in which the systems, components, and techniques described below can be implemented.

The system 100 includes a classical processor 102 and a post processing module 108. The system 100 may further include or be in data communication with quantum computing hardware 112.

Components of the quantum computing hardware 112 may include but is not limited to multiple qubits, quantum circuits (including quantum logic gates), control and measurement devices. Generally, the type of components included in the quantum computing hardware 112 may be dependent on the physical realizations of qubits included in the quantum computing hardware 112 and the type of computations performed by the quantum computing hardware 112.

For example, in some implementations the qubits may be superconducting qubits, e.g., e.g., superconducting charge qubits, superconducting flux qubits or superconducting phase qubits. In these examples the quantum computing hardware 112 may include one or more quantum circuits that implement controlled-phase quantum logic gates (e.g., controlled-Z quantum logic gates) as two-qubit gates, as well as other single qubit and multiple qubit gates. In some implementations the quantum circuits included in the quantum hardware 112 may include low depth quantum circuits, e.g., circuits whose depth is not more than approximately linear in L for circuits implemented in a two-dimensional lattice of L by L qubits.

Alternatively or in addition, the quantum computing hardware may include quantum circuits that operate on a two-dimensional lattice of qubits. In some implementations the quantum circuits may include the following set of quantum logic gates for a circuit with a depth d of clock cycles: (1) two-qubit quantum logic gates comprising controlled-phase (CZ) quantum logic gates, and (2) single qubit gates comprising gates from the set $\{X^{1/2}, Y^{1/2}, T\}$, where $X^{1/2}$ represents $$a\frac{\pi}{2}$$

rotation around the X axis of the Bloch sphere, $Y^{1/2}$ represents $$a\frac{\pi}{2}$$

rotation around the Y axis of the Bloch sphere, and T represents a non-Clifford diagonal matrix $$\{1, e^{\frac{i\pi}{4}}\}.$$

The classical processor 102 may receive as input data specifying a quantum circuit to be simulated, e.g., input data 104. For example, the classical processor 102 may receive input data specifying properties of a quantum circuit included in quantum hardware 112.

The classical processor 102 may generate as output data representing processed input data 104, e.g., output data 106. For example, the generated output data 106 may include data representing a probability of obtaining a particular bit string after application of a final clock cycle of the quantum circuit specified by input data 104 on a system of qubits.

The generated output data 106 may be provided to the post processing module 108 for processing or analyzing, e.g., as part of a quantum simulation process. For example, output data representing probabilities that different bit strings are output after application of the quantum circuit on a system of qubits may be processed or analyzed by the post processing module 108 to determine properties of the quantum circuit, e.g., its performance, or to calibrate, validate or benchmark the quantum circuit. The post processing module 108 may generate as output data representing determined properties of the quantum circuit, e.g., simulation data 110.

In some implementations the post processing module 108 may further generate as output data representing one or more adjustments 114 that may be used to adjust quantum hardware, e.g., quantum hardware 112. For example, the post processing module 108 may determine adjustments to the quantum circuit specified by the received input data 104 using the generated simulation data 110. For example, the simulation data 110 may be used with cross-entropy benchmarking to estimate an experimental fidelity of the quantum circuit and quantum logic gates implementation. An outer loop may then be performed to find optimal experimental controls to improve the fidelity.

In some implementations the classical processor 102 may include a processor with enhanced computational capabilities, e.g., a workstation. For example, in cases where the system 100 is configured to perform a method for simulation of quantum circuits, as described below with reference to FIG. 2, the system 100 may efficiently and exactly implement the method using a workstation and not require a supercomputer. In some implementations the classical processor 102 may include clusters of tensor processing units and central processing units, e.g., that run TensorFlow.

Programming the Hardware

Figure 2:
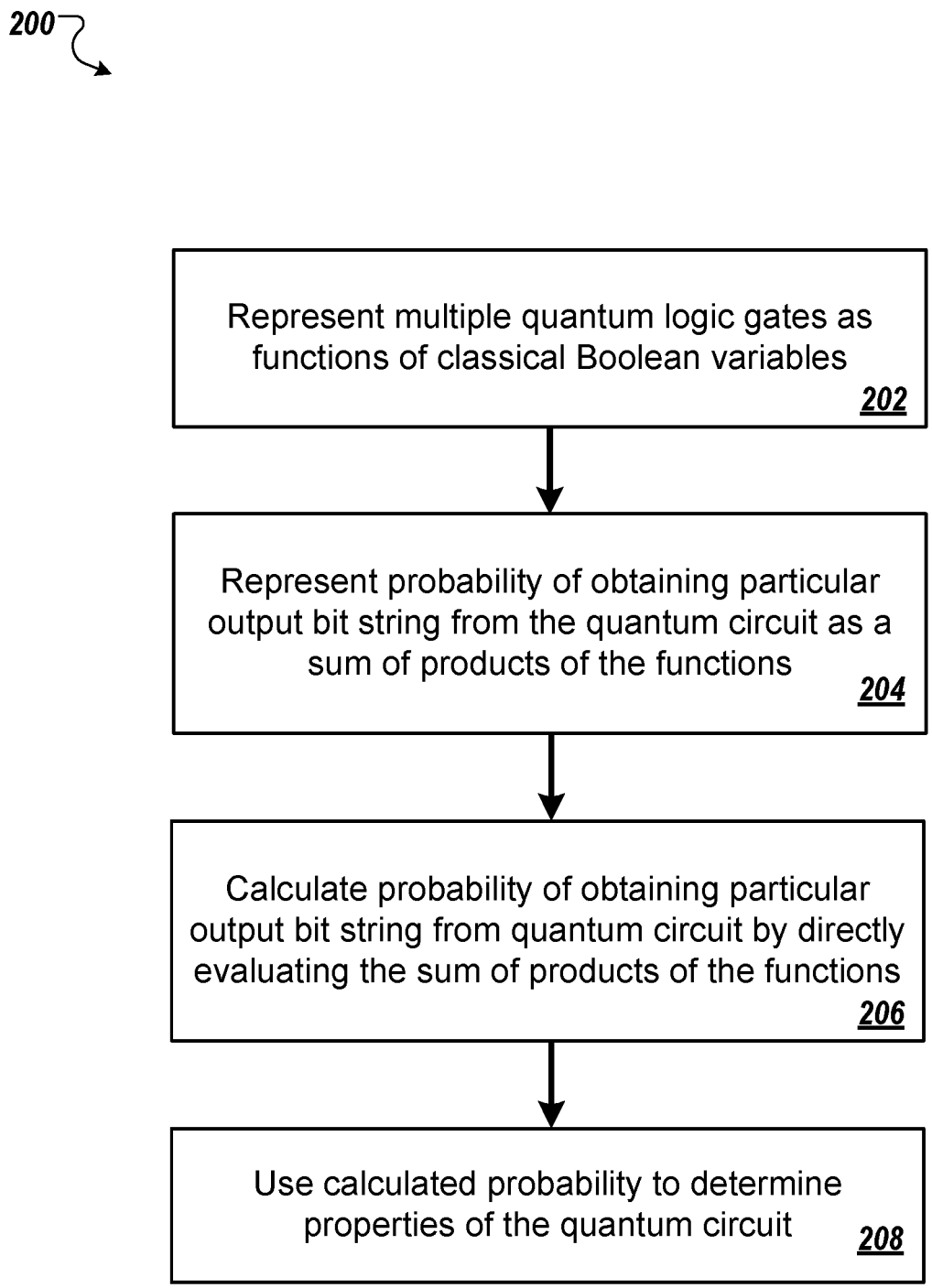
FIG. 2 is a flow diagram of an example process for the simulating a quantum circuit using controlled-phase gates.

FIG. 2 is a flow diagram of an example process 200 for simulating a quantum circuit that includes multiple quantum logic gates. For convenience, the process 200 will be described as being performed by a system of one or more classical computing devices located in one or more locations. For example, the system 100 of FIG. 1, appropriately programmed in accordance with this specification, can perform the process 200.

The system represents the multiple quantum logic gates as functions ψ of one or more classical Boolean variables (step 202). Each classical Boolean variable may be given by $b_j^k$ with the index j enumerating the qubits on which the quantum circuit operates, and the superscript k enumerating new variables along the worldline of a qubit j.

The functions ψ define an undirected graphical model with each classical Boolean variable $b_j^k$ representing a vertex in the undirected graphical model and each function ψ of respective classical Boolean variables representing a clique between vertices corresponding to the respective classical Boolean variables.

For example, in some implementations the quantum circuit may include one or more diagonal one-qubit quantum logic gates, where each diagonal one-qubit gate may be given by $$U^{1,d} = \sum_{b_j^k \in \{0,1\}} U_{b_j^k}^{1,d} |b_j^k\rangle\langle b_j^k|. \qquad (1)$$

In these implementations, the system may represent the quantum logic gate as a one-variable function that takes, as input, a classical Boolean variable indexing an element of the diagonal of a matrix representation of the quantum logic gate and provides, as output, the value of the element. For example, the system may represent the quantum logic gate as a one-variable function given by $$\psi^{1,d}(b_j^k) = U_{b_j^k}^{1,d}. \qquad (2)$$

Each input classical Boolean variable b of the one-variable functions $\psi^{1,d}$ maps to vertex in the undirected graphical model. An example quantum circuit representation of a diagonal one-qubit quantum logic gate and a corresponding graphical model representation is given below with reference to FIG. 3A.

As another example, in some implementations the quantum circuit may include one or more non-diagonal (also called two-sparse) one qubit quantum logic gates, where each non-diagonal one qubit gate may be given by $$U^{1,nd} = \sum_{b_j^k, b_j^{k+1} \in \{0,1\}} U^{1,nd}_{b_j^{k+1}, b_j^k} |b_j^{k+1}\rangle\langle b_j^k|. \quad (3)$$

In these implementations, the system may represent the quantum logic gate as a two-variable function that takes, as input, a pair of two classical Boolean variables indexing an element of a matrix representation of the quantum logic gate and provides, as output, a corresponding value of the element. For example, the system may represent the quantum logic gate as a two-variable function given by $$\psi^{1,nd}(b_j^{k+1}, b_j^k) = U^{1,nd}_{b_j^{k+1}, b_j^k} \quad (4)$$

where j represents the index of the qubit on which the quantum logic gate acts, and a new variable $b_j^{k+1}$ has been introduced along the worldline of the qubit.

Each pair of input classical Boolean variables $b_j^{k+1}$, $b_j^k$ of the two-variable function $\psi^{1,nd}$ maps to an edge between two connected vertices in the undirected graphical model. An example quantum circuit representation of a non-diagonal one-qubit quantum logic gate and a corresponding graphical model representation is given below with reference to FIG. 3B.

As another example, in some implementations the quantum circuit may include one or more diagonal two-qubit quantum logic gates, where each diagonal two-qubit quantum logic gate may be given by $$U^{2,d} = \sum_{b_j^k, b_{j'}^{k'} \in \{0,1\}} U^{2,d}_{b_j^k, b_{j'}^{k'}} |b_j^k, b_{j'}^{k'}\rangle\langle b_j^k, b_{j'}^{k'}| \quad (5)$$

In these implementations, the system may represent the quantum logic gate as a two-variable function that takes, as input, a pair of two classical Boolean variable indexing an element of a matrix representation of the quantum logic gate and provides, as output, the value of the element. For example, the system may represent the quantum logic gate as a two-variable function given by $$\psi^{2,nd}(b_j^k, b_{j'}^{k'}) = U^{2,nd}_{b_j^k, b_{j'}^{k'}}. \quad (6)$$

Each pair of input classical Boolean variables $b_j^k$, $b_{j'}^{k'}$ of the two-variable function $\psi^{2,nd}$ maps to an edge between two connected vertices in the undirected graphical model. An example quantum circuit representation of a diagonal two-qubit quantum logic gate and a corresponding graphical model representation is given below with reference to FIG. 3C.

As another example, in some implementations the quantum circuit may include one or more non-diagonal two qubit quantum logic gates, where each non-diagonal two qubit quantum logic gate may be given by $$U^{2,nd} = \sum_{b_j^{k+1}, b_{j'}^{k'+1}, b_j^k, b_{j'}^{k'} \in \{0,1\}} U^{2,nd}_{b_j^{k+1}, b_{j'}^{k'+1}, b_j^k, b_{j'}^{k'}} |b_j^{k+1}, b_{j'}^{k'+1}\rangle\langle b_j^k, b_{j'}^{k'}| \quad (7)$$

In these implementations, the system may represent the quantum logic gate as a four-variable function that takes, as input, four classical Boolean variable indexing an element of a matrix representation of the quantum logic gate and provides, as output, a corresponding value of the element. For example, the system may represent the quantum logic gate as a four-variable function given by $$\psi^{2,nd}(b_j^{k+1}, b_{j'}^{k'+1}, b_j^k, b_{j'}^{k'}) = U^{2,nd}_{b_j^{k+1}, b_{j'}^{k'+1}, b_j^k, b_{j'}^{k'}} \quad (8)$$

where the indices j, j' label the two qubits on which the quantum logic gate acts, and th worldline indexes k, k' are increased by one along the worldline of both qubits through the introduction of two new variables. Each combination of four input classical Boolean variables $b_j^{k+1}$, $b_{j'}^{k'+1}$, $b_j^k$, $b_{j'}^{k'}$ defines four fully connected vertices in the undirected graphical model. An example quantum circuit representation of a non-diagonal two-qubit quantum logic gate and a corresponding graphical model representation is given below with reference to FIG. 3D.

In cases where the quantum circuit includes quantum logic gates that operate on three or more qubits, the above descriptions for representing the quantum gates as functions of classical Boolean variables may be extended accordingly.

The system represents the probability of obtaining a particular output bit string from the quantum circuit as a first sum of products of the functions (step 204). The probability may be given by $$p(x)|\langle x|U|0\rangle|^2 = |\phi(x)|^2 \quad (9)$$

where U represents a sequence of one-qubit and two-qubit gates $U = U_v, \ldots, U_1$ and $|0\rangle$ represents an initial state, e.g., a product state $|0\rangle \equiv |0\rangle^{\otimes n}$.

The first sum of products of functions $\psi$ may be defined using techniques similar to the Feynman path representation and may be given by $$\phi(x) = \sum_{b_j^k \in \{0,1\}} \psi_{x_1}(b_1^{d_1}) \psi_{x_2}(b_2^{d_2}) \ldots \psi_v(b_{j_{v_1}}^{k_{v_1}}, b_{j_{v_2}}^{k_{v_2}}) \ldots \psi_1(b_n^1, b_n^0) \quad (10)$$

where the functions $\psi$ are defined above with reference to step 202.

The system calculates the probability of obtaining the particular output bit string from the quantum circuit by directly evaluating the sum of products of the functions (step 206). The system directly evaluates the sum of products of the functions using techniques developed in the context of exact inference for undirected graphical models (also known as Markov random fields). For example, the system may apply a Bucket elimination algorithm or variable elimination algorithm.

Typically, algorithms developed in the context of exact inference for undirected graphical models such as the variable elimination algorithm are applied to classical probabilistic models—that is probabilistic models that represent systems described by real numbers. However, in this specification the applicability of such algorithms is extended. The algorithms are applied to graphical models of quantum circuits that take imaginary values and are therefore not probabilistic in the classical sense. An example process of applying a variable elimination algorithm to directly evaluate a sum of products of functions is described below with reference to FIG. 5.

In some implementations graphical models of quantum circuits can be interpreted directly as an Ising model at imaginary temperature, as described below with reference to FIG. 6. In these implementations the applicability of algorithms developed in the context of exact inference for undirected graphical models is also extended to calculate a partition function of an Ising model at imaginary temperature. An example process for calculating the partition function of the classical Ising model at imaginary temperature exactly using a variable elimination algorithm is described below with reference to FIG. 7.

In some implementations calculating the probability of obtaining the particular output bit string from the quantum circuit by directly evaluating the sum of products of the functions may include fixing the value of the first classical Boolean variable $b_n^0$ in each worldline j to zero and fixing the value of the last classical Boolean variable $$b_j^{k_{v_j}}$$

in the worldline of qubit j to the value $x_j$ in the bit string in the sum to account for the initial state $|0\rangle$ and the final bit string x.

The system may use the calculated probability of obtaining a particular output bit string from the quantum circuit to determine properties of the quantum circuit (step 208). For example, the calculated probability may be used to determine the performance of the quantum circuit. As another example, the calculated probability may be used to (i) calibrate, (ii) validate, or (iii) benchmark quantum computing hardware implementing the quantum circuit.

The process 200 described above may be used to calculate the expectation value $\langle 0|U^\dagger O U|0\rangle$ of an operator O. To calculate the expectation value, the system may follow the above steps to represent the expected value of the operator as a second sum of products of the functions and calculate the defined expected value of the operator by directly evaluating the sum of products of the functions. For a local operator the expected value of the operator may be simplified by writing the circuit unitary U in terms of gates $U_\alpha$ and canceling terms $U_\alpha^\dagger U_\alpha = 1$ whenever possible.

Figure 3A:
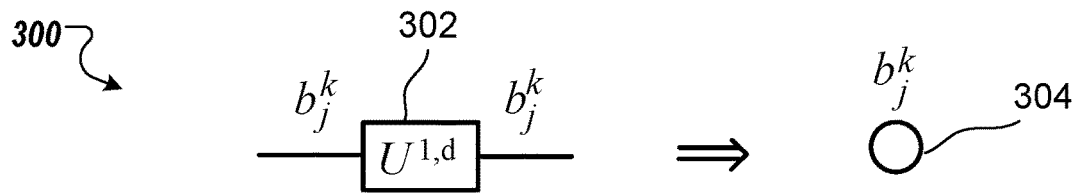
FIG. 3A is a diagram of an example diagonal one-qubit quantum logic gate and a corresponding graphical model representation.

FIG. 3A is a diagram 300 of a diagonal one-qubit quantum logic gate 302 and a corresponding graphical model representation 304. As described above with reference to step 202 and equation (1) of FIG. 2, the diagonal one-qubit quantum logic gate 302 maps to a single vertex 304 in a graphical representation of a quantum circuit that includes the diagonal one-qubit quantum logic gate 302.

Figure 3B:
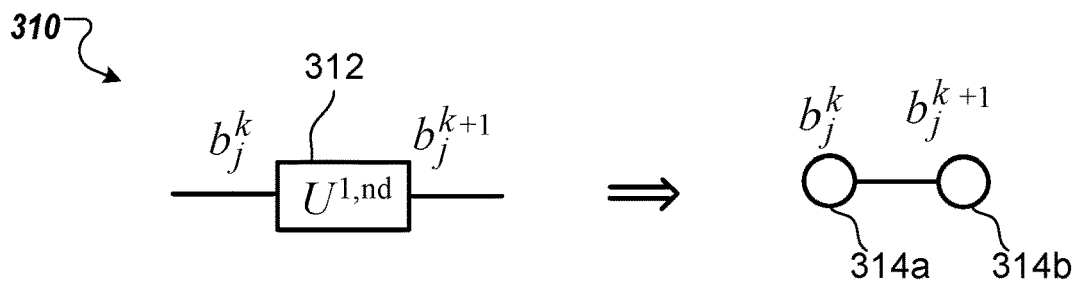
FIG. 3B is a diagram of an example non-diagonal one-qubit quantum logic gate and a corresponding graphical model representation.

FIG. 3B is a diagram 310 of an example non-diagonal one-qubit quantum logic gate 312 and a corresponding graphical model representation 314a, 314b. As described above with reference to step 202 and equation (3) of FIG. 2, the non-diagonal one-qubit quantum logic gate 312 maps to two connected vertices 314a, 314b in a graphical representation of a quantum circuit that includes the non-diagonal one-qubit quantum logic gate 312.

Figure 3C:
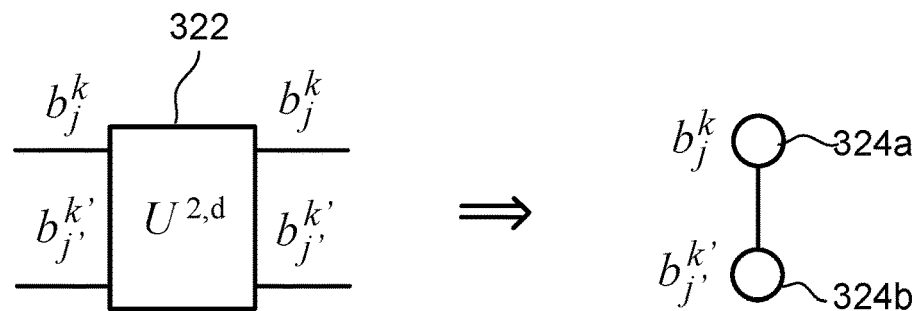
FIG. 3C is a diagram of an example diagonal two-qubit quantum logic gate and a corresponding graphical model representation.

FIG. 3C is a diagram 320 of an example diagonal two-qubit quantum logic gate 322 and a corresponding graphical model representation 324a, 324b. As described above with reference to step 202 and equation (5) of FIG. 2, the diagonal two-qubit quantum logic gate 322 maps to a link between two connected vertices 324a, 324b in a graphical representation of a quantum circuit that includes the non-diagonal one-qubit quantum logic gate 322.

Figure 3D:
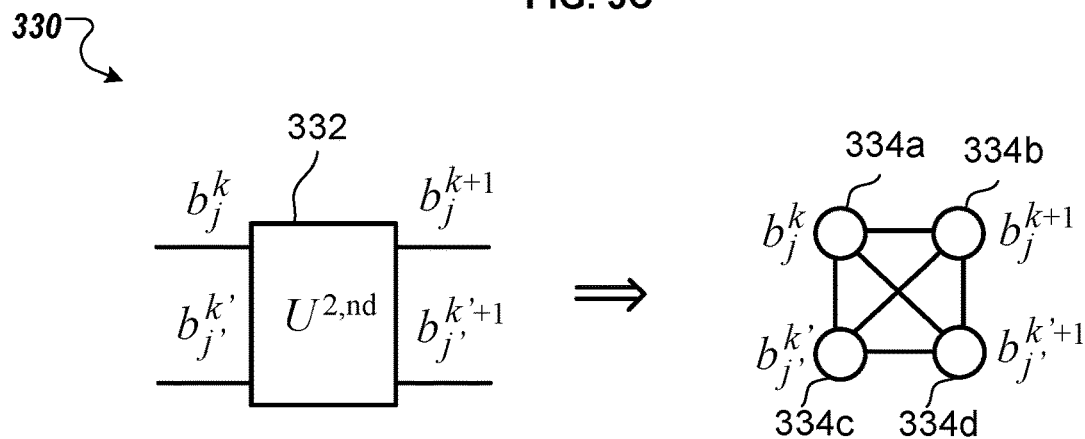
FIG. 3D is a diagram of an example non-diagonal two-qubit quantum logic gate and a corresponding graphical model representation.

FIG. 3D is a diagram 330 of an example non-diagonal two-qubit quantum logic gate 332 and a corresponding graphical model representation 334a, 334b. As described above with reference to step 202 and equation (7) of FIG. 2, the non-diagonal two-qubit quantum logic gate 322 maps to four fully connected vertices 334a, 334b, 334c, 334d in a graphical representation of a quantum circuit that includes the non-diagonal one-qubit quantum logic gate 332.

Figure 4:
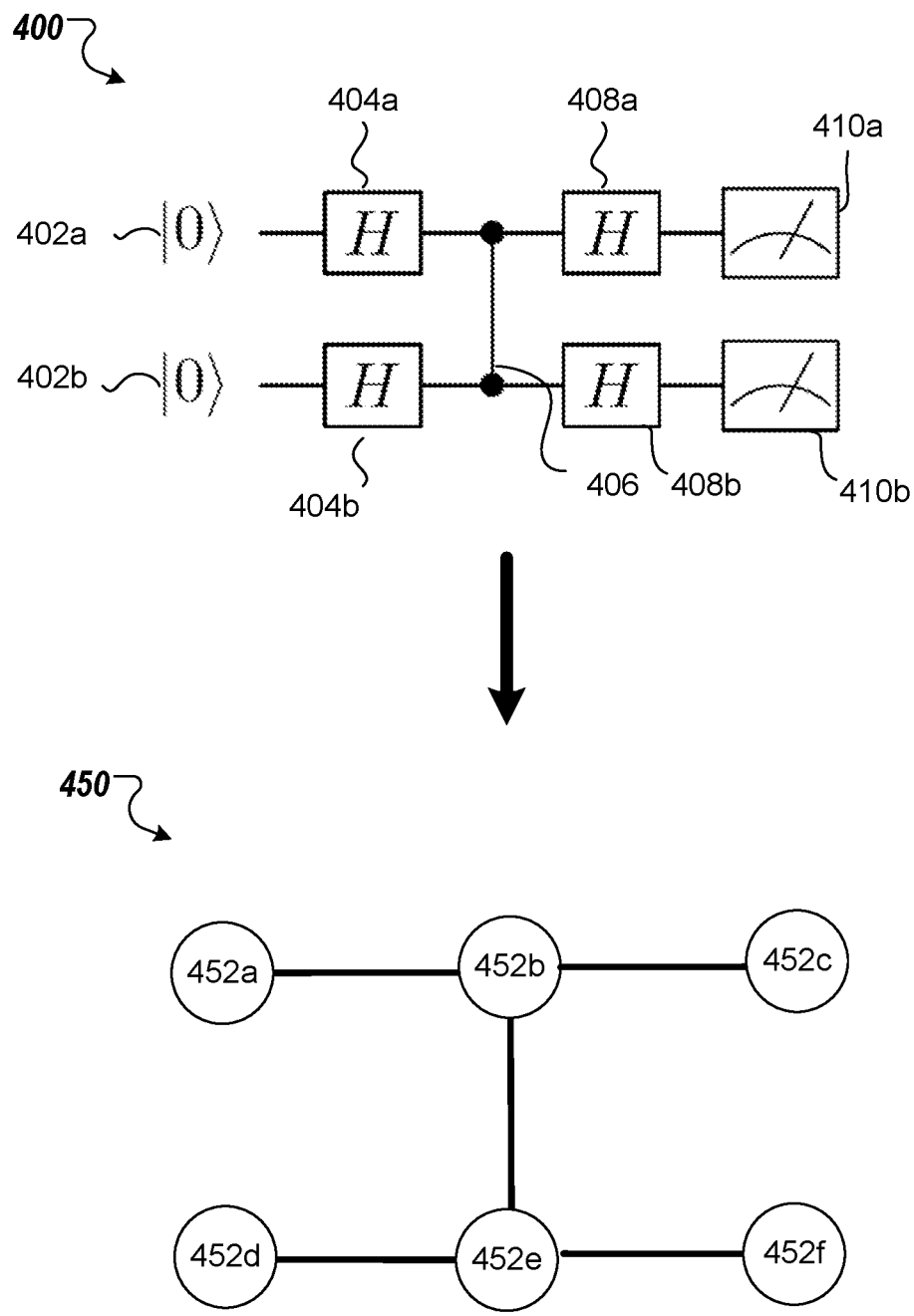
FIG. 4 is a diagram of an example quantum circuit and a corresponding undirected graphical model representation of the quantum circuit.

FIG. 4 is a diagram of an example quantum circuit 400 and a corresponding undirected graphical model representation 450 of the quantum circuit 400. The example quantum circuit 400 is configured to operate on a register of two qubits 402a and 402b. The example quantum circuit 400 includes a first Hadamard gate (non-diagonal single qubit gate) 404a that operates on the first qubit 402a, a second Hadamard 404b that operates on the second qubit 402b, a controlled-Z gate (diagonal two qubit gate) 406 that operates on both qubit 402a and 402b, a third Hadamard gate 408a that operates on the first qubit 402a and a fourth Hadamard gate 408b that operates on the second qubit 402b, and two measurement gates 410a, 410b.

The corresponding undirected graphical model representation 450 of the quantum circuit 400 includes six vertices 452a, 452b, 452c, 452d, 452e, 452f. Vertices 452a and 452b correspond to Hadamard gate 404a. Vertices 452d and 452e correspond to Hadamard gate 404b. Vertices 452b and 452e correspond to controlled-Z gate 406. Vertices 452b and 452c correspond to Hadamard gate 408a. Vertices 452e and 452f correspond to Hadamard gate 408b.

Figure 5:
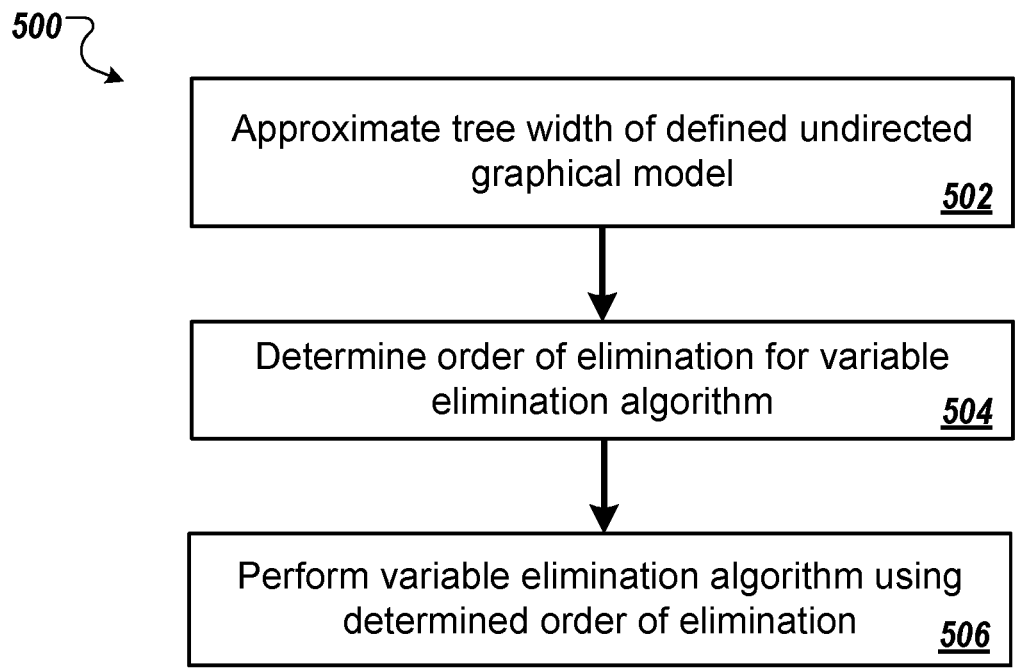
FIG. 5 is a flow diagram of an example process of applying a variable elimination algorithm to directly evaluate a sum of products of functions of one or more classical Boolean variables that represent multiple quantum logic gates.

FIG. 5 is a flow diagram of an example process 500 of applying a variable elimination algorithm to directly evaluate a sum of products of functions of one or more classical Boolean variables that represent multiple quantum logic gates. For convenience, the process 500 will be described as being performed by a system of one or more classical computing devices located in one or more locations. For example, the system 100 of FIG. 1, appropriately programmed in accordance with this specification, can perform the process 500.

The system approximates the treewidth of the defined undirected graphical model described above with reference to FIG. 2 (step 502). The treewidth of the defined undirected graphical model is defined to be the minimum induced width of the graphical model (graph) over all possible elimination orders of the graph. An elimination order is an ordering of vertices, and when a vertex X is eliminated, edges are added between all vertices connected to X. The induced width of an elimination order is the size of the maximum clique over all graphs formed followed the elimination order. A clique is a set of vertices where all pairs of vertices are connected by a link. The treewidth may be determined using one of multiple possible heuristic algorithms, such as QuickBB.

The system determines, based on the approximated treewidth, an order of elimination for the variable elimination algorithm (step 504). The order of elimination for the variable elimination algorithm is the same as the order of elimination of vertices described above with reference to step 502.

In some implementations alternative techniques may be used to determine an order of elimination for the variable elimination algorithm as described above with reference to steps 502 and 504. For example, for circuits with low depth and low dimension, the system may determine a vertical variable elimination ordering. To determine a vertical variable elimination ordering, the system may process one of the multiple qubits on which the quantum circuit operates at a time, eliminating all variables in one worldline sequentially before moving to a neighboring qubit. For example, for a quantum circuit in a 2D lattice of qubits with two-qubit gates restricted to nearest neighbors, the mapping of a circuit output amplitude to an undirected graphical model results in a graph defined on vertices corresponding to Boolean classical variables $b_k^j$, where the index j enumerates the qubits, and the superscript k enumerates new variables along the so-called worldline of a qubit j in the time direction. It is assumed that the qubit index j is ordered so that sequential values correspond to neighboring qubits in the underlying two dimensional lattice. Processing the qubits first along the worldline direction, called the vertical ordering of variable elimination, corresponds to eliminating variables in the lexicographical order of the pairs (j, k). That is, the system may eliminate all $b_k^j$ variables corresponding to qubit j sequential along the k index before moving to the variables corresponding to the qubit j+1.

The system evaluates the sum of products of the functions by performing the variable elimination algorithm with the determined order of elimination (step 506).

For example, to calculate an output amplitude for input $|00\rangle$ and output $|00\rangle$ for the quantum circuit 400 described above with reference to FIG. 4, the system first represents the quantum logic gates 404a, 404b, 406, 408a and 408b as classical Boolean variables $b_0^0$, $b_1^0$, $b_0^1$, $b_1^1$, $b_0^2$ and $b_1^2$, respectively. The system then maps the quantum circuit to a corresponding graphical representation 450, as described above with reference to FIG. 4. The vertices labelled 452a, 452b, 452c, 452d, 452e, and 452f in FIG. 4 correspond to the Boolean variables $b_0^0$, $b_0^1$, $b_0^2$, $b_1^0$, $b_1^1$ and $b_1^2$, respectively. Because the input and output are specified as $|00\rangle$, the system may eliminate the variables $b_0^0$, $b_0^2$, $b_1^0$, $b_1^2$, that is set $b_0^0 = b_0^2 = b_1^0 = b_1^2 = -$. The graphical model may therefore be simplified to two connected vertices corresponding to variables $b_0^1$ and $b_1^1$. The treewidth of this simplified graph is 2, since it is a clique with two vertices (it is noted that this is the same treewidth as the original graphical representation when first eliminating the variables $b_0^0$, $b_0^2$, $b_1^0$, $b_1^2$). The system then eliminates the variables $b_0^1$ and $b_1^1$ in any order.

More explicitly, the amplitude $\langle 00|C|00\rangle$ where C represents the quantum circuit 400 of FIG. 4 may be given by $$\langle 00|C|00\rangle = \sum_{b_0^1, b_1^1} \psi_H(0, b_0^1) \psi_{CZ}(b_0^1, , b_1^1) \psi_H(b_0^1, 0) \psi_H(0, b_1^1) \psi_H(b_1^1, 0) \quad (11)$$

where the function $\psi_H$ corresponds to a Hadamard gate and is given by the table

| | |
|---|---|
| 0 0 | $1/\sqrt{2}$ |
| 0 1 | $1/\sqrt{2}$ |
| 1 0 | $1/\sqrt{2}$ |
| 1 1 | $-1/\sqrt{2}$ |

The function $\psi_{CZ}$ corresponds to a controlled-Z gate and is given by the table

| | |
|---|---|
| 0 0 | 1 |
| 0 1 | 1 |
| 1 0 | 1 |
| 1 1 | −1 |

Equation (11) may therefore be written as $$\langle 00|C|00\rangle = \Sigma_{b_0^1, b_1^1} \tau_1(b_0^1, b_1^1)$$

where the function $\tau_1$ is given by the table

| | |
|---|---|
| 0 0 | 1/4 |
| 0 1 | 1/4 |
| 1 0 | 1/4 |
| 1 1 | −1/4 |

Summing over the variable $b_1^1$ gives $$\langle 00|C|00\rangle = \Sigma_{, b_0^1} \tau_2(b_0^1)$$

where the function $\tau_2$ is given by the table

| | |
|---|---|
| 0 | 1/2 |
| 1 | 0 |

Summing over $b_0^1$ gives $\langle 00|C|00\rangle = 1/2$.

Figure 6:
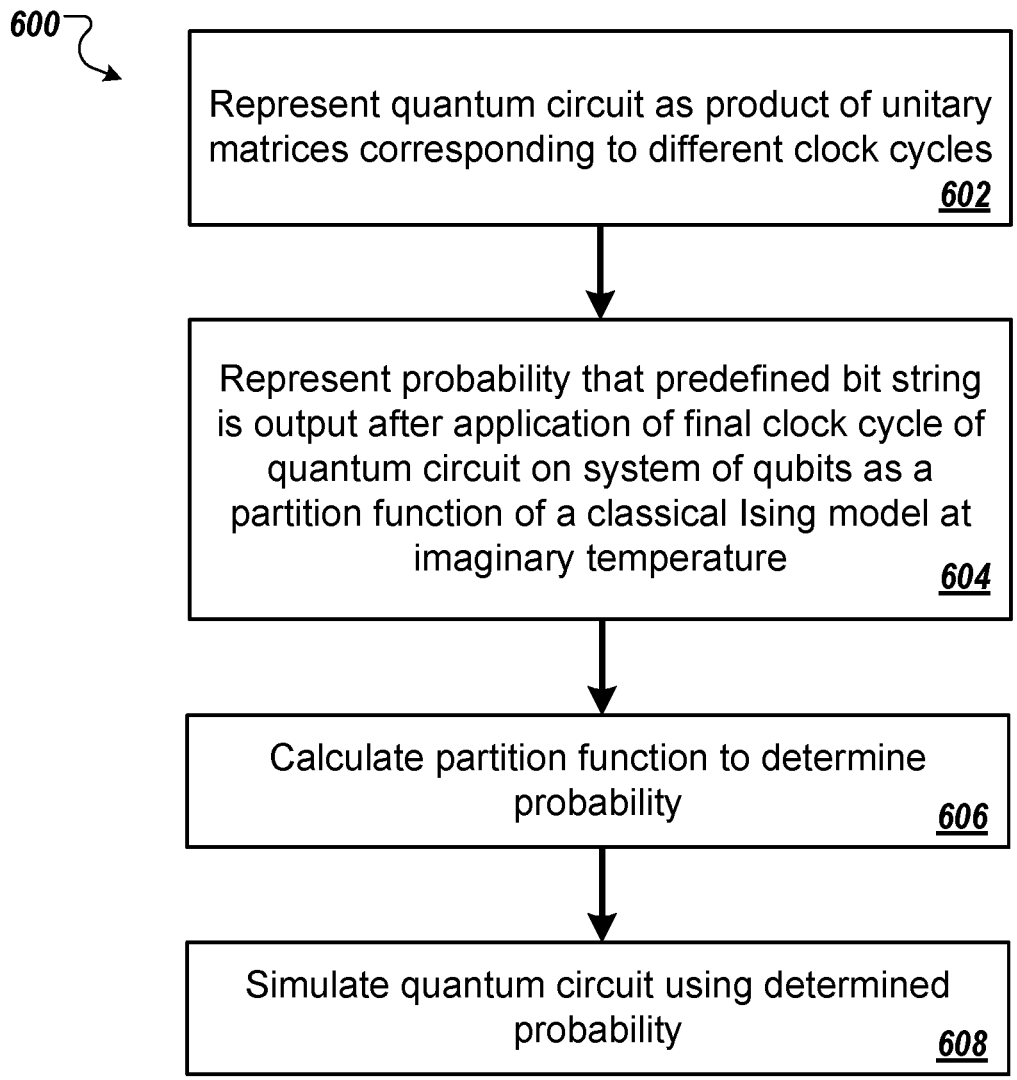
FIG. 6 is a flow diagram of an example process for partition function simulation of a quantum circuit.

FIG. 6 is a flow diagram of an example process 600 for partition function simulation of a quantum circuit. For convenience, the process 600 will be described as being performed by a system of one or more classical computing devices located in one or more locations. For example, the system 100 of FIG. 1, appropriately programmed in accordance with this specification, can perform the process 600.

The system represents the quantum circuit as a product of unitary matrices $U^{(t)}$ corresponding to a sequence of clock cycles $t \in \{1, \ldots, d\}$ (step 602). As described above with reference to FIG. 1, in some implementations the quantum circuit may be a circuit that is configured to operate on a system of qubits arranged as a two-dimensional lattice, e.g., with nearest neighbor connectivity. In some implementations the quantum circuit may include (i) controlled-phase (CZ) quantum logic gates as two-qubit gates, and (ii) $X^{1/2}$, $Y^{1/2}$, and non-Clifford T quantum logic gates as single qubit gates, where $X^{1/2}$ represents $$a\frac{\pi}{2}$$

rotation around the X axis of the Bloch sphere, $Y^{1/2}$ represents $$a\frac{\pi}{2}$$

rotation around the Y axis of the Bloch sphere, and T represents a diagonal matrix $$\left\{1, e^{\frac{i\pi}{4}}\right\}.$$

The system represents a probability that a predefined bit string is output after application of a final clock cycle of the quantum circuit on a system of qubits as a partition function of a classical Ising model at imaginary temperature (step 604).

The probability that a predefined bit string is output after application of a final clock cycle of the quantum circuit on a system of qubits is dependent on the product of unitary matrices $U^{(t)}$ and may be given by $$\langle x | \psi_d \rangle = \sum_{\{\sigma_t\}} \prod_{t=0}^{d} \langle \sigma^t | U^{(t)} | \sigma^{t-1} \rangle, \quad |\sigma^d\rangle = |x\rangle \quad (11)$$

where $|x\rangle$ resents the predefined bit string, $|\psi_d\rangle$ represents the state of the system of n qubits after application of the final clock cycle d of the quantum circuit, U(t) represents the product of unitary matrices corresponding to the sequence of clock cycles 1 to d, and $|\sigma^t\rangle = \otimes_{j=1}^{n} |\sigma_j^t\rangle$ with the assignments of $\sigma_j^t = \pm 1$ corresponding to the states 0 and 1 of the j-th qubit, respectively.

To represent the probability that the predefined bit string is output after application of a final clock cycle of the quantum circuit as a partition function of a classical Ising model at imaginary temperature, the system may express the probability, e.g., the right hand side of equation (1) above, as a Feynman path integral with individual paths $\{\sigma^{-1}, \sigma^0, \ldots, \sigma^d\}$ formed by a sequence of the computational basis states of the n qubit system. The initial conditions for each path may correspond to $\sigma_j^{-1} = 0$ for all qubits and the final point corresponds to $|\sigma^d\rangle = |x\rangle$.

If a T quantum logic gate is applied to qubit j at cycle t, the indices of the matrix $\rangle^t |U^{(t)}|\sigma^{t-1}\rangle$ may be equal to each other, i.e. $\sigma_j^t = \sigma_j^{t-1}$. A similar property may apply to the CZ quantum logic gate as well. The state of a qubit can only flip under the action of the quantum logic gates H, $X^{1/2}$, $Y^{1/2}$. These quantum logic gates may be referred to as two-sparse gates since they contain two nonzero elements in each row and column (unlike T and CZ quantum logic gates). This observation allows for the path integral representation in equation (1) above to be rewritten.

Through the quantum circuit, each qubit j may have a sequence of two-sparse gates applied to it. The length of this sequence may be denoted as d(j)+1 (this includes a 0-th cycle formed by a layer of Hadamard gates applied to each qubit). In a given path the qubit j goes through the sequence of spin states $\{s_j^k\}_{k=0}^{d(j)}$ where $s_j^k = \pm 1$. The value of $s_j^k$ in the sequence may determine the state of the qubit immediately after the action of the k-th two-sparse gate. The last element in the sequence may be fixed by the assignment of bits in the bit-string x, $$s_j^{d(j)} = x^{(j)}, j \in [1, \ldots, n] \quad (12).$$

Therefore, an individual path in the path integral may be encoded by the set of $G = \sum_{j=1}^{n} d(j)$ binary variables $s = \{s_j^k\}$ with $j \in [1, \ldots, n]$ and $k \in [0, \ldots, d(j)-1]$. The explicit form of the two-sparse gates shows that the absolute values of the probability amplitudes associated with different paths are all the same and equal to $2^{-G/2}$. Therefore, the system may represent the probability given by equation (1) above as a partition function of a classical Ising model at imaginary temperature given by $$\langle x | \psi_d \rangle = 2^{-G/2} \sum_s \exp\left(\frac{i\pi}{4} H_S(x)\right) \quad (13)$$

where $$\frac{i\pi}{4} H_S(x)$$

represents the phase factors associated with each path in the path integral that depends explicitly on the end point condition and $$\frac{i\pi}{4}$$

is the imaginary temperature.

The system may then determine values of the phase factors $$\frac{i\pi}{4} H_S(x)$$

accumulated as a sum of discrete phase changes associated with individual quantum logic gates in the quantum circuit.

For example, to determine values of the phase factors $$\frac{i\pi}{4} H_S(x)$$

accumulated as a sum of discrete phase changes associated with the $X^{1/2}$ and $Y^{1/2}$ gates the system may define, for the k-th two-sparse gate applied to qubit j, the coefficient $\alpha_j^k$ where $\alpha_j^k = 1$ if the quantum logic gate is $X^{1/2}$ and $\alpha_j^k = 0$ if the quantum logic gate is $Y^{1/2}$. The system may then determine the total phase change accumulated from the application of $X^{1/2}$ and $Y^{1/2}$ gates via $$\frac{i\pi}{4} H_s^{X^{1/2}}(x) = \frac{i\pi}{2} \sum_{j=1}^{n} \sum_{k=0}^{d(j)} \alpha_j^k \frac{1 + s_j^{k-1} s_j^k}{2}, \quad (14)$$

$$\frac{i\pi}{4} H_s^{Y^{1/2}}(x) = i\pi \sum_{j=1}^{n} \sum_{k=0}^{d(j)} (1 - \alpha_j^k) \frac{1 - s_j^{k-1}}{2} \frac{1 + s_j^k}{2}$$

To determine the values of the phase factors $$\frac{i\pi}{4}H_s(x)$$

accumulated as a sum of discrete phase changes associated with the T and CZ quantum logic gates, the system may introduce coefficients d(j, t) equal to the number of two-sparse gates applied to qubit j over the first t cycles (including the 0-th cycle of Hadamard gates). The system may further introduce coefficients $\tau_j^t$ such that $\tau_j^t=1$ if a T gate is applied at cycle t to qubit j and $\Sigma j^t=0$ otherwise. The system may then determine the total phase change accumulated from the application of T gates via $$\frac{i\pi}{4}H_s^T(x) = \frac{i\pi}{4}\sum_{j=1}^{n}\sum_{t=0}^{d}T_j^t\frac{1-s_j^{d(j,t)}}{2}. \quad (15)$$

For a given pair of qubits (i, j) the system may introduce the coefficients $z_{ij}^t$ such that $z_{ij}^t=1$ if a CZ gate is applied to the qubit pair during cycle t and $z_{ij}^t=0$ otherwise. The system may then determine the total phase change accumulated from the application of CZ gates via $$\frac{i\pi}{4}H_s^{CZ}(x) = i\pi\sum_{i=1}^{n}\sum_{j=1}^{i-1}\sum_{t=0}^{d}z_{ij}^t\frac{1-s_i^{d(i,t)}}{2}\frac{1-s_j^{d(j,t)}}{2}. \quad (16)$$

Comparing equation (13) above with equations (14)-(16) above shows that the probabilities $\langle x|\psi_d\rangle$ defined in equation (13) take the form of a partition function a classical Ising model with energy $H_s$ for state s and purely imaginary inverse temperature $$\frac{i\pi}{4}.$$

The total phase for each of the individual paths $\{\sigma^{-1}, \sigma^0, \ldots, \sigma^d\}$ takes 8 distinct values (mod $2\pi$) equal to $$\left\{0, \frac{\pi}{4}, \ldots, \frac{7\pi}{4}\right\}.$$

The system calculates the partition function of the classical Ising model at imaginary temperature to determine the probability that the predefined bit string is output after application of the final clock cycle of the quantum circuit on the system of qubits (step 606).

The system calculates the partition function of the classical Ising model at imaginary temperature exactly by applying one or more algorithms that are typically used for performing exact inference on graphical models to exactly calculate the partition function. Example algorithms include but are not limited to bucket elimination algorithms, sum product algorithms or variable elimination algorithms. As described above with reference to FIG. 5, typically, algorithms developed in the context of exact inference for undirected graphical models such as the variable elimination algorithm are applied to classical probabilistic models—that is probabilistic models that represent systems described by real numbers. However, in this specification the applicability of such algorithms is extended. An example process for calculating the partition function of the classical Ising model at imaginary temperature exactly using a variable elimination algorithm, is described below with reference to FIG. 7.

The probability that the predefined bit string is output after application of the final clock cycle of the quantum circuit on the system of qubits is used to simulate the quantum circuit (step 608). For example, the determined probability may be used to determine the performance of the quantum circuit, or used to calibrate, validate, or benchmark quantum computing hardware implementing the quantum circuit. In some implementations the system may use the determined probability and/or results of simulating the quantum circuit to determine adjustments that may improve the quantum circuit, e.g., improve the accuracy of the quantum circuit.

Figure 7:
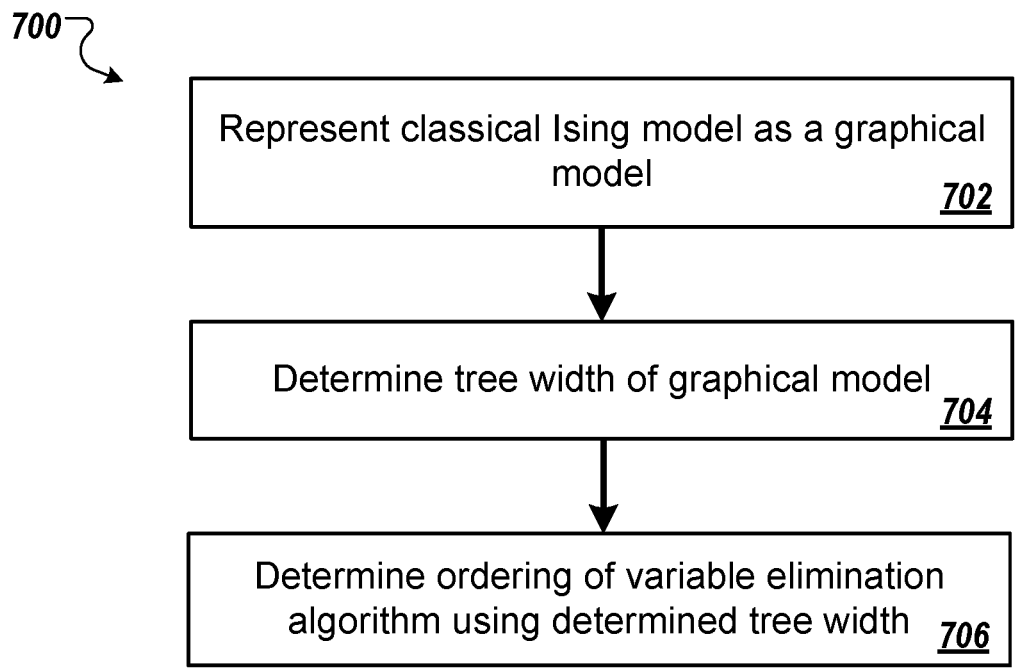
FIG. 7 is a flow diagram of an example process for calculating the partition function of the classical Ising model at imaginary temperature exactly.

FIG. 7 is a flow diagram of an example process 700 for calculating the partition function of the classical Ising model at imaginary temperature exactly using a variable elimination algorithm. For convenience, the process 700 will be described as being performed by a system of one or more classical computing devices located in one or more locations. For example, the system 100 of FIG. 1, appropriately programmed in accordance with this specification, can perform the process 700.

The system represents the classical Ising model as a graphical model (step 702). The graphical model (also called an interaction model) is a graph of nodes and edges. Nodes in the graphical model represent spins in the classical Ising model. Edges between nodes represent couplings between spins in the classical Ising model. To represent the classical Ising model as a graphical model, the system determines the values of coupling coefficients between spins in the classical Ising model.

To determine the values of coupling coefficients between spins, the system represents the energy of the classical Ising model $H_S(x)$ given in equation (13) above as a sum of three different types of terms $$H_S(x) = H^{(0)} + H_s^{(1)} + H^{(2)}. \quad (17)$$

The first term $H_S^{(0)}$ represents an energy term quadratic in spin variables and is expressed in terms of the Ising coupling coefficients $\mathcal{J}_{ij}^{kl}$ and local fields $h_i^k$ (given below in equation (20)) and may be given by $$H_s^{(0)} = \sum_{i=1}^{n}\sum_{k=1}^{d(i)-1}h_i s_i + \sum_{i=1}^{n}\sum_{j=1}^{i-1}\sum_{k=1}^{d(s)-1}\sum_{t=1}^{d(j)-1}\mathcal{J}_{ij}^{kl}s_i^k s_j^i. \quad (18)$$

The term $H_s^{(0)}$ does not depend on the spin configuration x of the final point on the paths.

The second term $H_s^{(1)}$ represents a bilinear function of Ising spin variables s and x and may be given by $$H_s^{(1)}(x) = \sum_{i=1}^{n}\sum_{j=1}^{n}\sum_{k=1}^{d(i)-1}b_{ij}^k s_i^k x^{(j)}. \quad (19)$$

The third term $H^{(2)}$ is dependent on the spin variable x and not s, i.e., $H^{(2)} H^{(2)}(x)$.

The local fields $h_i^k$ may be computed using the below equation $$h_i^k = \alpha_i^{k+1} - \alpha_i^k - \frac{1}{2}J_i^k - \sum_{j=1}^{n}\sum_{t=1}^{d(j)} J_{ij}^{kl} \quad (20)$$

The Ising coupling coefficients $\mathcal{J}_{ij}^{kl}$ may be computed using the below $$\mathcal{J}_{ij}^{kl} = J_{ij}^{kl} + \frac{1}{2}\delta_{i,j}(\delta_{k-1,l} + \delta_{k,l-1})(2\alpha_i^{(k+i+1)/2} \ldots 1) \quad (21)$$

where $$J_{ij}^{kl} = \sum_{t=1}^{d} \delta_{k,d(i,t)}\delta_{t,d(j,t)}x_{ij}^t, \quad (22)$$

and $$J_i^k = \sum_{t=1}^{d} \delta_{k,d(i,t)}T_i^t. \quad (23)$$

The coefficients $b_{ij}^k$ in equation (19) may be computed using the below equation.

$$b_{ij}^k = \delta_{k,d(i)-1}\delta_{ij}(2\alpha_j^{d(j)}-1) + J_{ij}^{kd(j)} \quad (24)$$

The Ising coupling for spin $s_j^{d(j)}=x^{(j)}$ induces an additional local field $\Sigma_{j=1}^{n}\Sigma_{k=1}^{d(i)-1}b_{ij}^k x^{(j)}$ on spin $s_i^k$ as shown in equation (8) above.

The above equations (17)-(24) enable the system to define the structure of the graphical model. The system further describes the evolution of qubit states under the action of the quantum logic gates in the quantum circuit by introducing a third dimension to describe the graph of Ising couplings given in equation (21). For each qubit j a worldline with a grid of points enumerated by $t \in [1 \ldots d]$ is introduced, with each point corresponding to a layer. The graphical model corresponding to the coefficients $\mathcal{J}_{ij}^{kl}$ therefore represents a quasi three-dimensional structure formed by worldlines corresponding to qubits located on a 2D lattice. According to equation (21), in the same worldline only neighboring vertices are coupled. The strength of the coupling is $+/-\frac{1}{2}$ depending on the type of the two-sparse gate. In general, each vertex can be "laterally" coupled to other vertices located on the neighboring worldlines.

The system approximates the treewidth of the graphical model (step 704). The treewidth of the graphical model is defined as the minimum induced width of the graphical model (graph) over all possible elimination orders of the graph. An elimination order is an ordering of vertices, and when a vertex X is eliminated, edges are added between all vertices connected to X. The induced width of an elimination order is the size of the maximum clique over all graphs formed followed the elimination order. A clique is a set of vertices where all pairs of vertices are connected by a link. The treewidth may be determined one of multiple possible heuristic algorithms, such as QuickBB. In some implementations the system may store approximated treewidths in a cache. In these implementations, approximating the treewidth of the graphical model may include determining that the graphical model matches a previously generated graphical model and querying the cache to retrieve a previously computed treewidth for the graphical model.

The system determines the ordering of the variable elimination algorithm using the determined treewidth (step 706). The order of elimination for the variable elimination algorithm is the same as the order of elimination of vertices described above with reference to step 704.

The system calculates the partition function of the classical Ising model at imaginary temperature exactly by performing the variable elimination algorithm (step 708). Performing the variable elimination algorithm may proceed as described above with reference to step 506 of FIG. 5, where functions $\psi$ are given by exponentials of Ising terms.

Figure 8:
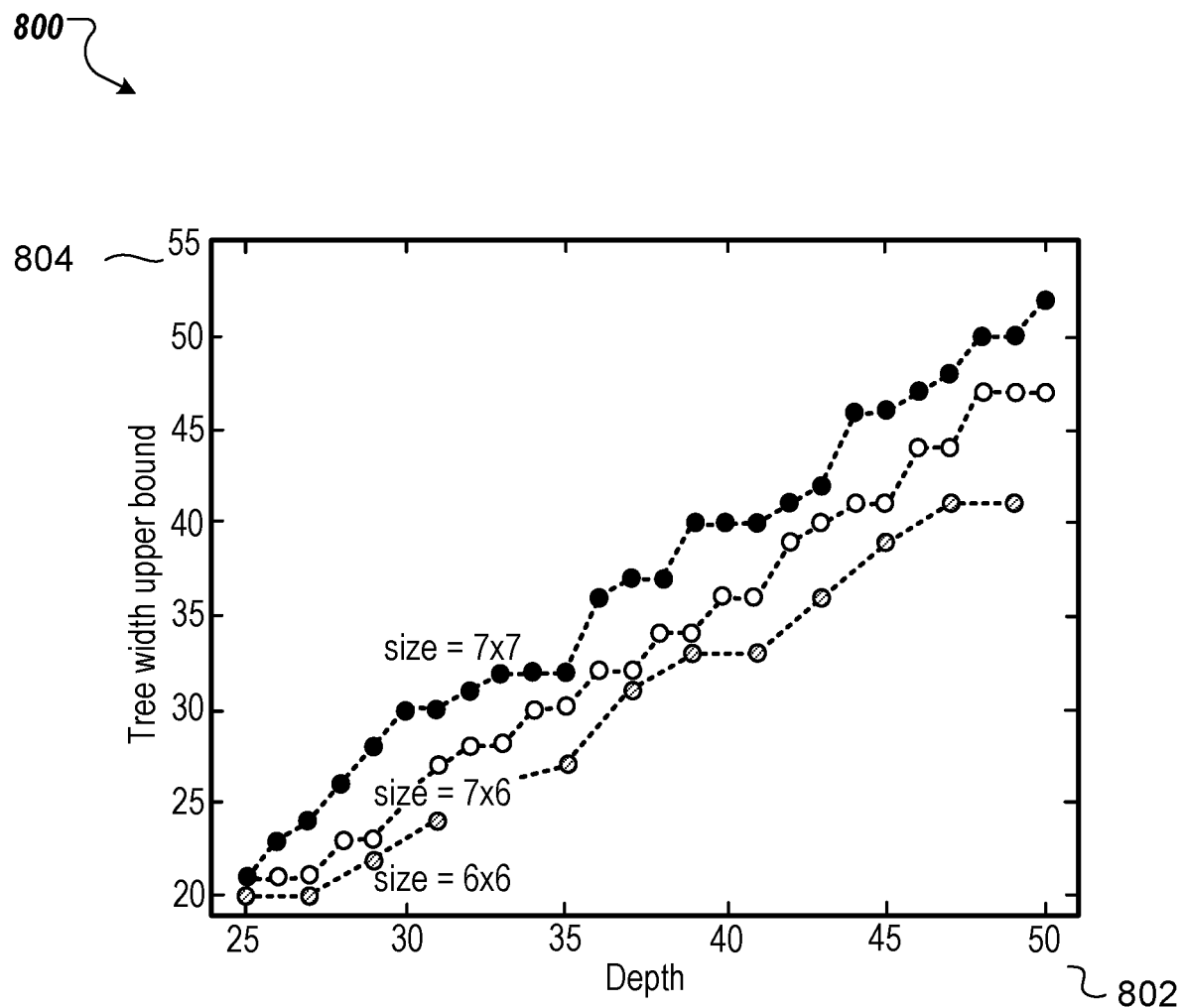
FIG. 8 is a plot of a numerical upper bound for the treewidth of an interaction graph of an Ising model corresponding to a quantum circuit with 6×6, 7×6, and 7×7 qubits as a function of circuit depth.

FIG. 8 is a plot 800 of an example numerical upper bound for the treewidth of an interaction graph of an Ising model corresponding to quantum circuits with 6×6, 7×6, and 7×7 qubits as a function of circuit depth.

The quantum circuits used to generate plot 800 included circuits described above with reference to FIG. 1, namely quantum circuits with 6×6, 7×6, and 7×7 qubits as a function of circuit depth that (1) start with a cycle of Hadamard gates (0-th clock cycle), and (2) repeat for d clock cycles: (a) place controlled-phase (CZ) gates alternating between eight configurations, and (b) place single-qubit gates chosen at random from the set $\{X^{1/2}, Y^{1/2}, T\}$ at all qubits that are not occupied by the CZ gates at the same cycle (subject to the restrictions below). The gate $X^{1/2}$ (or $Y^{1/2}$) represents $$a\frac{\pi}{2}$$

rotation around the X (or Y) axis of the Bloch sphere, and T represents a non-Clifford diagonal matrix $\{1, e^{i\pi/4}\}$.

In addition, single-qubit gates are placed subject to the following rules: (1) Place a gate at qubit q only if this qubit is occupied by a CZ gate in the previous cycle; (2) Place a T gate at qubit q if there are no single qubit gates in the previous cycles at qubit q except for the initial cycle of Hadamard gates; (3) Any gate at qubit q should be different from the gate at qubit q in the previous cycle.

The plot 800 includes a horizontal axis 802 representing circuit depth and a vertical axis 804 representing treewidth upper bound. The plot 800 shows that the treewidth for quantum circuits with 7×6 qubits and depth 40 is not larger than 37. This implies that these circuits can be simulated in a workstation with memory cost proportional to 2^37, whereas a simulation based in applying matrix multiplication to the state vector will have a memory cost proportional to 2^(6×7)=2^42 and require a supercomputer.

Figure 9:
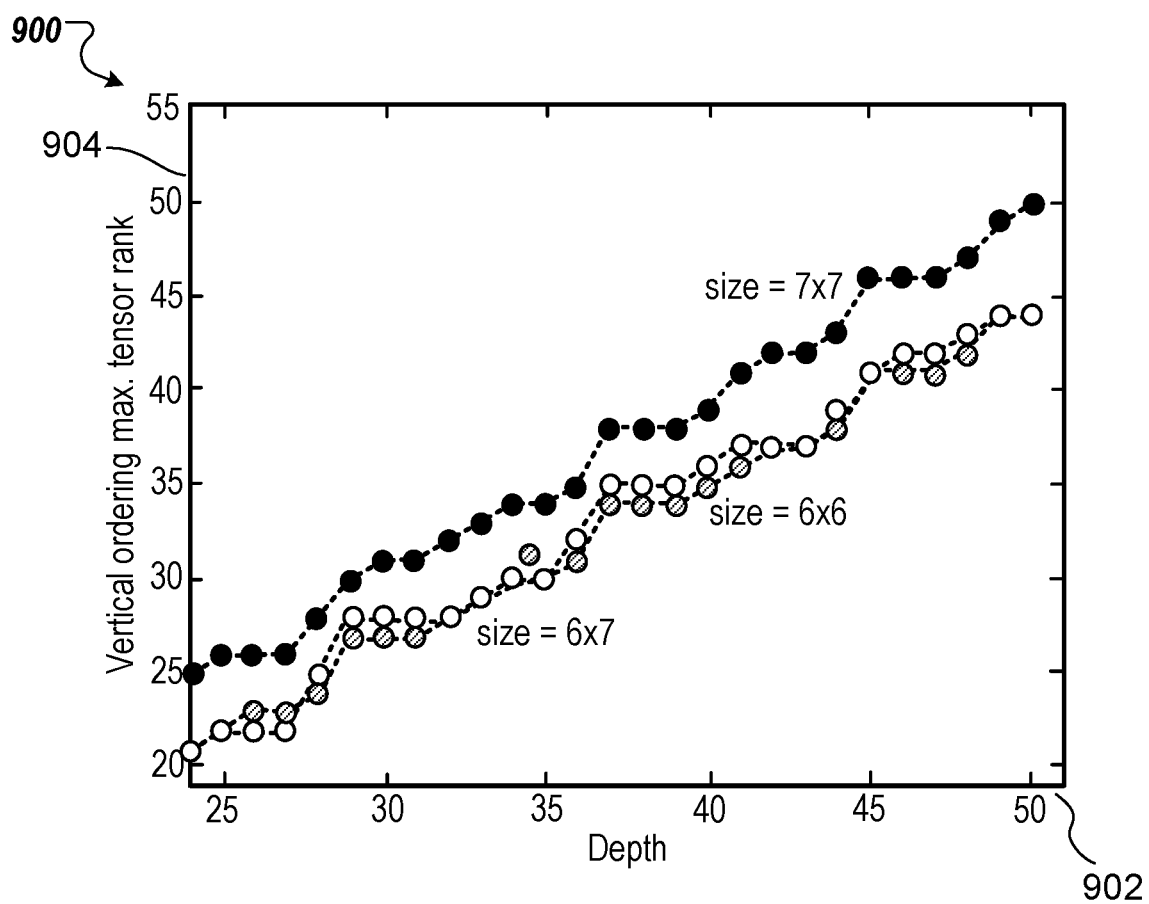
FIG. 9 is a plot of the size of the maximum tensor rank as a function of circuit depth for quantum circuits with 6×6, 7×6 and 7×7 qubits using a vertical elimination ordering.

FIG. 9 is a plot 900 of the size of the maximum tensor rank as a function of circuit depth for quantum circuits with 6×6, 7×6 and 7×7 qubits using a vertical elimination ordering.

Plot 900 includes a horizontal axis 902 representing circuit depth and a vertical axis 804 representing maximum tensor rank using vertical elimination ordering. The plot 900 exhibits small variations between instances of the same circuit size, showing that the instance of circuit size 7×6 has a larger tensor size in this ordering than the instance of size 7×7.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A computer-implemented method for simulating a quantum circuit, the method comprising:
   receiving data representing the quantum circuit, wherein the quantum circuit comprises multiple quantum logic gates;
   generating a simulation of the quantum circuit using the received data, comprising:
      representing the multiple quantum logic gates specified by the received data as functions of one or more classical Boolean variables, wherein the functions of one or more classical Boolean variables define a undirected graphical model with each classical Boolean variable representing a vertex in the undirected graphical model and each function of respective classical Boolean variables representing a clique between vertices corresponding to the respective classical Boolean variables;
      representing a probability of obtaining a particular output bit string from the quantum circuit as a first sum of products of the functions; and
      calculating the probability of obtaining the particular output bit string from the quantum circuit by directly evaluating the sum of products of the functions;
   determining one or more properties of the quantum circuit using the generated simulation.

2. The method of claim 1, wherein directly evaluating the sum of products of the functions comprises applying techniques for performing exact inference for undirected graphical models.

3. The method of claim 2, wherein applying techniques for performing exact inference for undirected graphical models comprises applying a variable elimination algorithm.

4. The method of claim 3, wherein applying a variable elimination algorithm comprises:
   approximating a treewidth of the defined undirected graphical model;
   determining, based on the approximated treewidth, an order of elimination for the variable elimination algorithm; and
   evaluating the sum of products of the functions by performing the variable elimination algorithm with the determined order of elimination.

5. The method of claim 3, wherein applying a variable elimination algorithm comprises determining a vertical order of elimination for the variable elimination algorithm and performing the variable elimination algorithm using the determined order.

6. The method of claim 1, wherein the classical Boolean variables enumerate (i) each qubit in a system of qubits on which the quantum circuit operates, and, for each qubit (ii) new variables along the worldline of the qubit.

7. The method of claim 6, wherein calculating the probability of obtaining the particular output bit string from the quantum circuit by directly evaluating the sum of products of the functions comprises:
   fixing a value of a first classical Boolean variable in each worldline to zero; and
   fixing a value of a last classical Boolean variable in the worldline of qubit j to a value in the bit string corresponding to position j.

8. The method of claim 1, wherein representing the multiple quantum logic gates as functions of one or more classical Boolean variables comprises, for each diagonal one qubit quantum logic gate:
representing the quantum logic gate as a one-variable function that takes, as input, a classical Boolean variable indexing an element in the diagonal of a matrix representation of the quantum logic gate and provides, as output, the value of the element.

9. The method of claim 8, wherein each input classical Boolean variable of the one-variable function is mapped to a vertex corresponding to this variable in the undirected graphical model.

10. The method of claim 1, wherein representing the multiple quantum logic gates as functions of one or more classical Boolean variables comprises, for each non-diagonal one qubit quantum logic gate:
representing the quantum logic gate as a two-variable function that takes, as input, a pair of two classical Boolean variables indexing an element of a matrix representation of the quantum logic gate and provides, as output, a corresponding value of the element.

11. The method of claim 10, wherein each function of a pair of input classical Boolean variables is mapped to an edge connecting two vertices corresponding to these variables in the undirected graphical model.

12. The method of any of claim 1, wherein representing the multiple quantum logic gates as functions of one or more classical Boolean variables comprises, for each diagonal two qubit quantum logic gate:
representing the quantum logic gate as a two-variable function that takes, as input, a pair of two classical Boolean variable indexing an element in the diagonal of a matrix representation of the quantum logic gate and provides, as output, the value of the element.

13. The method of claim 12, wherein each function of a pair of input classical Boolean variables is mapped to an edge connecting two vertices corresponding to these variables in the undirected graphical model.

14. The method of any of claim 1, wherein representing the multiple quantum logic gates as functions of one or more classical Boolean variables comprises, for each non-diagonal two qubit quantum logic gate:
representing the quantum logic gate as a four-variable function that takes, as input, four classical Boolean variable indexing an element of a matrix representation of the quantum logic gate and provides, as output, a corresponding value of the element.

15. The method of claim 14, wherein each function of four input classical Boolean variables is mapped to links connecting four fully connected vertices corresponding to these variables in the undirected graphical model.

16. The method of claim 1, wherein the one or more properties of the quantum circuit comprise the performance of the quantum circuit.

17. The method of claim 1, further comprising using the determined one or more properties to (i) calibrate, (ii) validate, or (iii) benchmark quantum computing hardware implementing the quantum circuit.

18. The method of claim 1, further comprising:
representing the expected value of an operator as a second sum of products of the functions; and
calculating the defined expected value of the operator by directly evaluating the sum of products of the functions.

19. A system comprising one or more computers and one or more storage devices storing instructions that are operable, when executed by the one or more computers, to cause the one or more computers to perform the method of any of claims 1 to 18, the operations of:
receiving data representing a quantum circuit, wherein the quantum circuit comprises multiple quantum logic gates;
generating a simulation of the quantum circuit using the received data, comprising:
representing the multiple quantum logic gates specified by the received data as functions of one or more classical Boolean variables, wherein the functions of one or more classical Boolean variables define a undirected graphical model with each classical Boolean variable representing a vertex in the undirected graphical model and each function of respective classical Boolean variables representing a clique between vertices corresponding to the respective classical Boolean variables;
representing a probability of obtaining a particular output bit string from the quantum circuit as a first sum of products of the functions; and
calculating the probability of obtaining the particular output bit string from the quantum circuit by directly evaluating the sum of products of the functions;
determining one or more properties of the quantum circuit using the generated simulation.

20. A non-transitory computer storage medium encoded with instructions that, when executed by one or more computers, cause the one or more computers to perform operations comprising:
receiving data representing a quantum circuit, wherein the quantum circuit comprises multiple quantum logic gates;
generating a simulation of the quantum circuit using the received data, comprising:
representing the multiple quantum logic gates specified by the received data as functions of one or more classical Boolean variables, wherein the functions of one or more classical Boolean variables define a undirected graphical model with each classical Boolean variable representing a vertex in the undirected graphical model and each function of respective classical Boolean variables representing a clique between vertices corresponding to the respective classical Boolean variables;
representing a probability of obtaining a particular output bit string from the quantum circuit as a first sum of products of the functions; and
calculating the probability of obtaining the particular output bit string from the quantum circuit by directly evaluating the sum of products of the functions;
determining one or more properties of the quantum circuit using the generated simulation.

* * * * *